(12) United States Patent
Kandel et al.

(10) Patent No.: US 7,528,941 B2
(45) Date of Patent: *May 5, 2009

(54) ORDER SELECTED OVERLAY METROLOGY

(75) Inventors: Daniel Kandel, Aseret (IL); Vladimir Levinski, Nazareth Ilit (IL); Michael E. Adel, Zichron Ya'akov (IL); Joel L. Seligson, Misgav (IL)

(73) Assignee: KLA-Tencor Technolgies Corporation, Milpitas, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/754,892

(22) Filed: May 29, 2007

(65) Prior Publication Data

US 2007/0279630 A1 Dec. 6, 2007

Related U.S. Application Data

(60) Provisional application No. 60/897,637, filed on Jan. 26, 2007, provisional application No. 60/810,560, filed on Jun. 1, 2006.

(51) Int. Cl.
*G01N 21/00* (2006.01)
(52) U.S. Cl. .................. 356/237.2; 356/237.6; 356/600
(58) Field of Classification Search ... 356/237.2–237.6, 356/600, 601
See application file for complete search history.

(56) References Cited

U.S. PATENT DOCUMENTS 7,068,833 B1 6/2006 Ghinovker et al.
7,385,699 B2 * 6/2008 Mieher et al. ............... 356/401
2003/0223630 A1 12/2003 Adel et al.
2004/0169861 A1 9/2004 Mieher et al.
2005/0157297 A1 7/2005 Abdulhalim et al.
2005/0195398 A1 9/2005 Adel et al.

OTHER PUBLICATIONS

International Search Report and Written Opinion dated Aug. 20, 2008 issued in WO 2007/143056.

* cited by examiner

*Primary Examiner*—L. G. Lauchman
*Assistant Examiner*—Iyabo S Alli
(74) *Attorney, Agent, or Firm*—Weaver Austin Villeneuve & Sampson LLP

(57) ABSTRACT

Disclosed are apparatus and methods for measuring a characteristic, such as overlay, of a semiconductor target. In general, order-selected imaging and/or illumination is performed while collecting an image from a target using a metrology system. In one implementation, tunable spatial modulation is provided only in the imaging path of the system. In other implementations, tunable spatial modulation is provided in both the illumination and imaging paths of the system. In a specific implementation, tunable spatial modulation is used to image side-by-side gratings with diffraction orders ±n. The side-by-side gratings may be in different layers or the same layer of a semiconductor wafer. The overlay between the structures is typically found by measuring the distance between centers symmetry of the gratings. In this embodiment, only orders ±n for a given choice of n (where n is an integer and not equal to zero) are selected, and the gratings are only imaged with these diffraction orders.

27 Claims, 15 Drawing Sheets

In pupil plane
(ideal location)

In closest accessible
plane
(acceptable solution)

Closest accessible plane
NOT close enough →
Orders overlap

ORDER SELECTED OVERLAY METROLOGY

CROSS REFERENCE TO RELATED APPLICATIONS

The present application claims priority under 35 U.S.C. §119(e) from U.S. Provisional Patent Application No. 60/810,560 entitled "ORDER SELECTED OVERLAY METROLOGY" filed Jun. 1, 2006, and U.S. Provisional Patent Application No. 60/897,637 entitled "SYSTEMS AND TECHNIQUES FOR SEMICONDUCTOR METROLOGY INSPECTION" filed Jan. 26, 2007, which applications are incorporated herein by reference for all purposes.

BACKGROUND OF THE INVENTION

The invention pertains to systems and methods for performing overlay measurements on semiconductor structures and the like.

An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a workpiece (e.g., semiconductor wafer). The structures may take the form of gratings, and these gratings may be periodic. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern.

There continues to be a need for improved techniques and apparatus for measuring and determining overlay.

SUMMARY OF THE INVENTION

Accordingly, apparatus and methods for measuring a characteristic, such as overlay, of a semiconductor target are provided. In general, order-selected imaging and/or illumination is performed while collecting an image from a target using a metrology system. In one implementation, tunable spatial modulation is provided only in the imaging path of the system. In other implementations, tunable spatial modulation is provided in both the illumination and imaging paths of the system. In a specific implementation, tunable spatial modulation is used to image side-by-side gratings with diffraction orders ±n. The side-by-side gratings may be in different layers or the same layer of a semiconductor wafer. The overlay between the structures is typically found by measuring the distance between centers symmetry of the gratings. In this embodiment, only orders ±n for a given choice of n (where n is an integer and not equal to zero) are selected, and the gratings are imaged with only these diffraction orders.

In one embodiment, an optical apparatus for measuring a characteristic of a semiconductor target is disclosed. The apparatus includes an illumination system for generating and directing illumination rays towards a semiconductor target via an illumination path and an imaging system for directing light scattered from the semiconductor target in response to the illumination rays. The imaging system has an image sensor for forming an image from scattered light, one or more optical components that are arranged to direct the scattered light to the sensor via an imaging path, and a tunable spatial modulation device for selectively directing specific diffraction orders of the scattered light towards the image sensor while blocking selected other diffraction orders of the scattered light from reaching the image sensor.

In a specific implementation, the tunable spatial modulation device is positioned at a plane that is substantially conjugate to the pupil of the imaging path. In a further aspect, the imaging system further comprises relay optics for receiving the scattered light and forming the plane that is substantially conjugate to the pupil of the imaging path. In yet a further aspect, the semiconductor target is formed from one or more grating structures and the tunable spatial modulation device is configurable to selectively direct only one or more ±n pairs of orders towards the sensor, wherein n is an integer that is not zero. In a specific implementation, the tunable spatial modulation device is configurable to selectively direct only diffraction orders ±1 towards the sensor.

In another implementation, the illumination system includes a second tunable spatial modulation device for selectively directing one or more of the illumination rays at specific illumination angles (or normal) and numerical apertures towards the semiconductor target, wherein the second tunable spatial modulation device is positioned at a plane that is substantially conjugate to the pupil of the illumination path. In another aspect, the tunable spatial modulation device includes one or more of the following: a replaceable mechanical aperture, a spatial light modulator (SLM), or a diffractive optical element (DOE). In yet another feature, the pupil of the imaging path is inaccessible and the tunable spatial modulation device is positioned at a plane that is the closest accessible plane to the pupil of the imaging path.

In an alternative embodiment, the invention pertains to a method of measuring a characteristic of a semiconductor target. A set of diffraction orders to use for imaging the semiconductor target is determined. A metrology tool is then configured so as to image the target using the determined set of diffraction orders. An image of the target that is formed from the determined set of diffraction orders is collected. An overlay error is determined and stored based on the collected image.

In a specific example, the semiconductor target is formed from side-by-side gratings that are each formed in a different layer or by a different process and that are arranged for determining an alignment error between the side-by-side gratings. The determined set of diffraction orders include only ±n diffraction orders, wherein n is an integer and not equal to zero so as to maximize contrast of the collected image. In a further aspect, the semiconductor target is formed from an upper grating over a lower grating that formed in different layers that are arranged for determining an overlay error between the upper and lower gratings. The scattered light has a fine pitch portion associated with the pitch of the gratings and a course pitch portion produced by a Moiré effect. In this example, the course pitch portion is imaged using only ±n diffraction orders, wherein n is an integer and not equal to zero, and the fine pitch portion is left unresolved. In a specific example, the determined set of diffraction orders include only ±1 diffraction orders so as to maximize contrast of the collected image.

In another example, the semiconductor target is formed from an upper grating over a lower grating that formed in different layers that are arranged for determining an overlay error between the upper and lower gratings. The scattered light has characteristics associated with the fine pitch of the gratings and with a course pitch produced by a Moiré effect. In this example, the semiconductor target is imaged using only ±n diffraction orders of the course pitch, wherein n is an integer and not equal to zero, and the fine pitch is left unresolved. Alternatively, the semiconductor target is imaged using only ±n diffraction orders of the fine pitch, wherein n is an integer and not equal to zero, and using many orders of the course pitch, including the zero order. In yet another implementation, the semiconductor target is imaged using only ±n diffraction orders of the fine pitch, wherein n is an integer and not equal to zero, and using only ±m diffraction orders of the course pitch, wherein m is an integer and not equal to zero.

In a specific embodiment, the semiconductor target is formed from a first set of gratings having a first characteristic and a second set of gratings having a second characteristic that differs from the first characteristic. For example, the first and second characteristics correspond to first and second pitch values. In another example, the first and second characteristics correspond to first and second rotation angles. In a further aspect, it is determined that there is no overlay error when a center of symmetry of the target equals a geometric center of the target.

In another embodiment, the invention pertains to at least one computer readable storage medium having computer program instructions stored thereon that are arranged to perform one or more of the above described operations.

These and other features will be presented in more detail in the following specification of the invention and the accompanying figures, which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, embodiments of the invention pertain to systems and methods are described herein with respect to performing overlay measurements via order-selected imaging and/or illumination. However, the order-selected imaging or illumination may be applied to any suitable metrology or inspection application in which order selection would be desirable. In overlay metrology, it has been found that accuracy and repeatability, as well as other aspects, of the overlay measurements can be significantly improved by imaging the targets with diffraction orders +n and −n.

Figure 1:
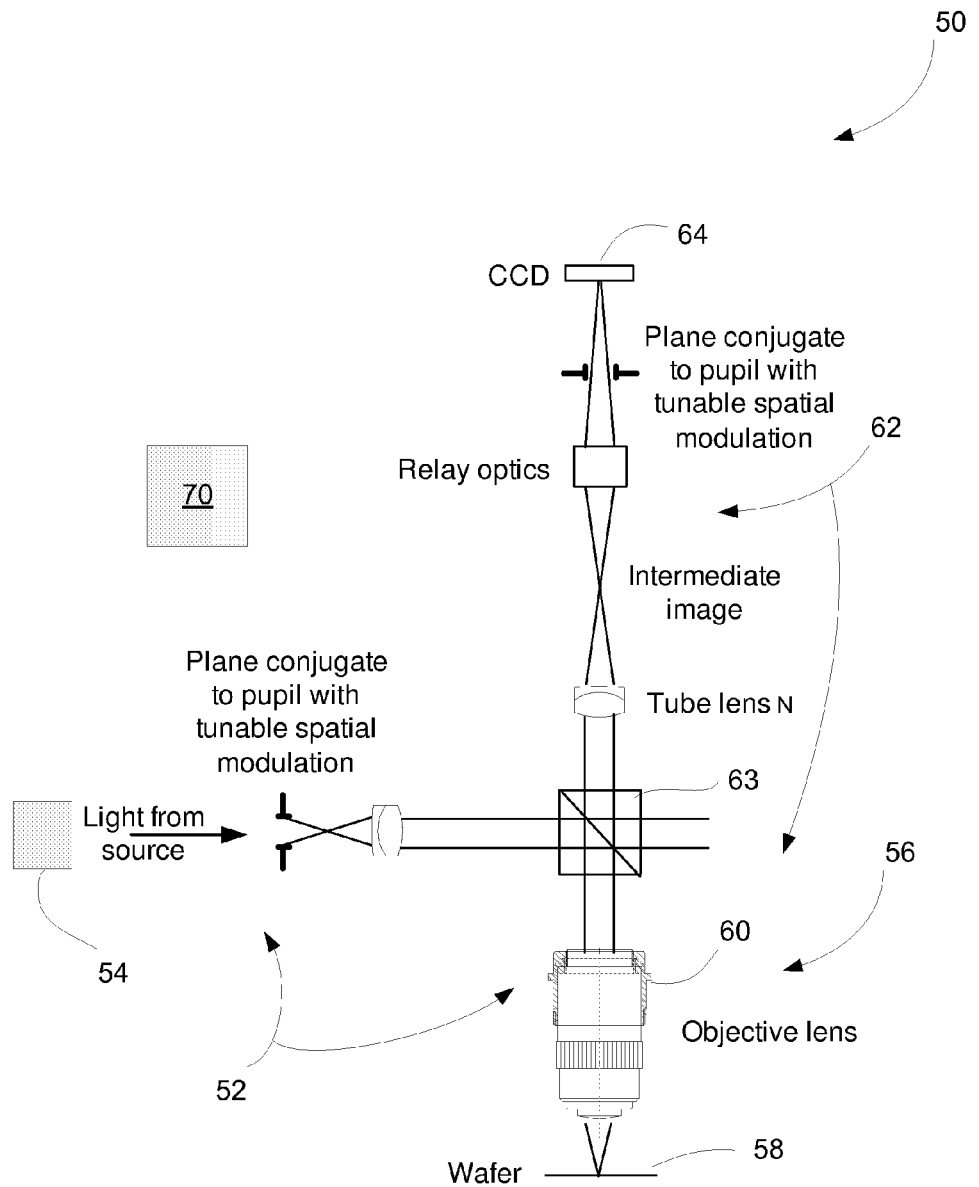
FIG. 1 is a diagram of a microscope, in accordance with one embodiment of the present invention.

FIG. 1 is a diagram of a microscope 50, in accordance with one embodiment of the present invention. The microscope 50 is primarily configured for semiconductor metrology and/or semiconductor inspection tools. For example, the microscope 50 may be used to perform any one or more of the following measurements: overlay measurements, line width measurements, defect measurements, etc.

The microscope 50 includes an illumination system 52 configured to generate illumination rays and then direct such illumination rays towards a sample. The illumination system 52 generally includes a light source 54 and various optical components, which are disposed along an illumination path. In the illustrated example, the illumination system includes optical components 56 that also form part of an imaging system 62 for directing light scattered from the sample in response to the illumination rays. That is, optical components 56 are configured to both illuminate a sample 58 with the illumination rays provided by the light source 54 and collects light propagating from or scattering off the sample 58. Of course, the illumination system 52 may be configured to form an illumination path for the illumination rays that is separate from the scattered light path that is formed through the imaging system.

In the illustrated implementation, the optical components 56 include an objective lens 60 that is configured to focus the illumination rays onto the sample 58 (within a field of view and at an area of interest), and also collect the light that scatters off the surface of the sample 58. The light scattering off the sample 58 is directed to components of the imaging system 62 along an imaging path.

The imaging system 62 generally includes an image sensor 64 and various optical components for directing the scattered light to the sensor 64. The imaging system 62 may, for example, include a beam splitter 63 that separates the illumination path from the imaging path so that the scattered light is directed towards an image sensor 64. The beam splitter, in this example, also forms part of the illumination system 52 and is configured to direct illumination rays towards the sample.

In general, the sensor 64 can be formed so as to receive the scattered light and transform it into an image. The image sensor 64 can take any suitable form for sensing the scattered light, such as a CCD (charge coupled device), CCD arrays, a TDI (time delay integration) sensor, TDI sensor arrays, PMT's (photo multiplier tubes), or many other sensors known to those having ordinary skill in the art. The image can then be analyzed by controller 70, for example, to determine overlay error, line width, and defects associated with the sample (e.g., semiconductor wafer).

The system 50 may also include controller 70 that is configured to control various components of the microscope and analyze data and/or images collected by such components. For instance, the controller 70 may be configured to synchronize the illumination and imaging systems 52 and 62, and more particularly the light source 54 and image sensor 64, so that images can be taken of the surface of the sample 58. The controller 70 may also, for example, provide commands for controlling the illumination characteristics of the illumination system 52 (e.g., light source). The controller 70 may also provide commands for controlling imaging characteristics (e.g., frame grabbing times) of the imaging system 62 (e.g., image sensor). The controller 70 may also receive information, such as the image data, from the image sensor 64. The controller 70 may also provide commands for positioning the objective lens 60 and sample 58 so that a desired location of the sample 58 can be properly imaged.

In accordance with one embodiment, the microscope 50 provides a tunable spatial modulation device at a plane that is conjugate or approximately conjugate to the pupil in either or both the illumination and imaging paths. A tunable spatial modulation device may, for example, include one or more replaceable mechanical apertures, one or more spatial light modulators (SLM), one or more diffractive optical elements (DOE), or the like. A spatial modulation device in the illumination path enables the selection of the illumination angle and NA through the use of spatial modulation. This modulation may be further optimized for each wavelength or wavelength band independently. A spatial modulation device in the imaging path allows a choice of angles at which light reflected from a wafer is collected by the imaging system. For grating structures, for example as used in overlay measurements, this choice enables imaging with pre-selected diffraction orders ±n.

In one example, the modulation device is configured in such a way as to separate the diffractive orders of the imaged light. Only the desired diffractive orders pass through to the image sensor, while all other diffractive orders are blocked from reaching the image senor. This order selection arrangement provides several advantages in certain metrology and inspection situations, especially with respect to overlay metrology as described further herein.

In one implementation, tunable spatial modulation is only provided on the imaging side. In other implementations, tunable spatial modulation is provided on both the illumination and imaging sides. Of course other configurations can be utilized. In a specific implementation, the tunable spatial modulation is used to image side-by-side gratings with diffraction orders ±n. The side-by-side gratings may be in different layers or the same layer of a semiconductor wafer. The overlay between the structures is typically found by measuring the distance between centers symmetry of the gratings. In this embodiment, only orders ±n for a given choice of n (where n is an integer and not equal to zero) are selected, and the gratings are only imaged with these diffraction orders. This arrangement offers many advantages including reducing sensitivity to optical aberrations and sensitivity to focus position. This arrangement also provides a significant improvement in the image contrast because of the elimination of the specular reflection (i.e., order 0), thus, reducing the background signal.

In another implementation, the tunable spatial modulation can be used to image grating-on-grating targets, and more particularly continuously varying offset (CVO) grating-on-grating targets. The CVO mark generally includes overlaid periodic structures, which have offsets in a characteristic of the overlaid structures that vary as a function of position. By way of example, the periodic structures may include an upper grating that has different value of pitch than the pitch of a lower grating. Small differences in pitch produce offsets between the upper and lower gratings that vary from a center to the edge of the overlaid gratings. Other example characteristics that may vary in the overlay gratings include line width, pitch, spacing, CD, rotation, etc.

A method for utilizing the CVO mark may include determining the center of symmetry of the CVO mark and comparing it to the geometric center of the mark. If there is zero overlay, the center of symmetry tends to coincide with the geometric center of the mark. If overlay is non-zero (e.g., misalignment between two layers), the center of symmetry is displaced from the geometric center of the mark. The displacement in conjunction with a preset gain factor G, which depends on the different offset values, associated with the mark is used to calculate the overlay error, $\epsilon$.

The main advantage of CVO targets is that overlay error, $\epsilon$, can be translated into a shift of $G\epsilon$ in the position of the center of symmetry of each of these overlaid gratings, where the gain factor G can be much larger than 1 (typically 10-50). The gain factor can be defined as the result of the Moiré effect where the reflection from the gratings generates a signal with a periodicity of a coarse pitch approximately equal to G p. Most contributions to inaccuracy in the overlay measurement can be reduced by the preset gain factor (G) in CVO targets. In addition, sensitivity to focus and field position is reduced by the use of CVO targets.

Figure 2:
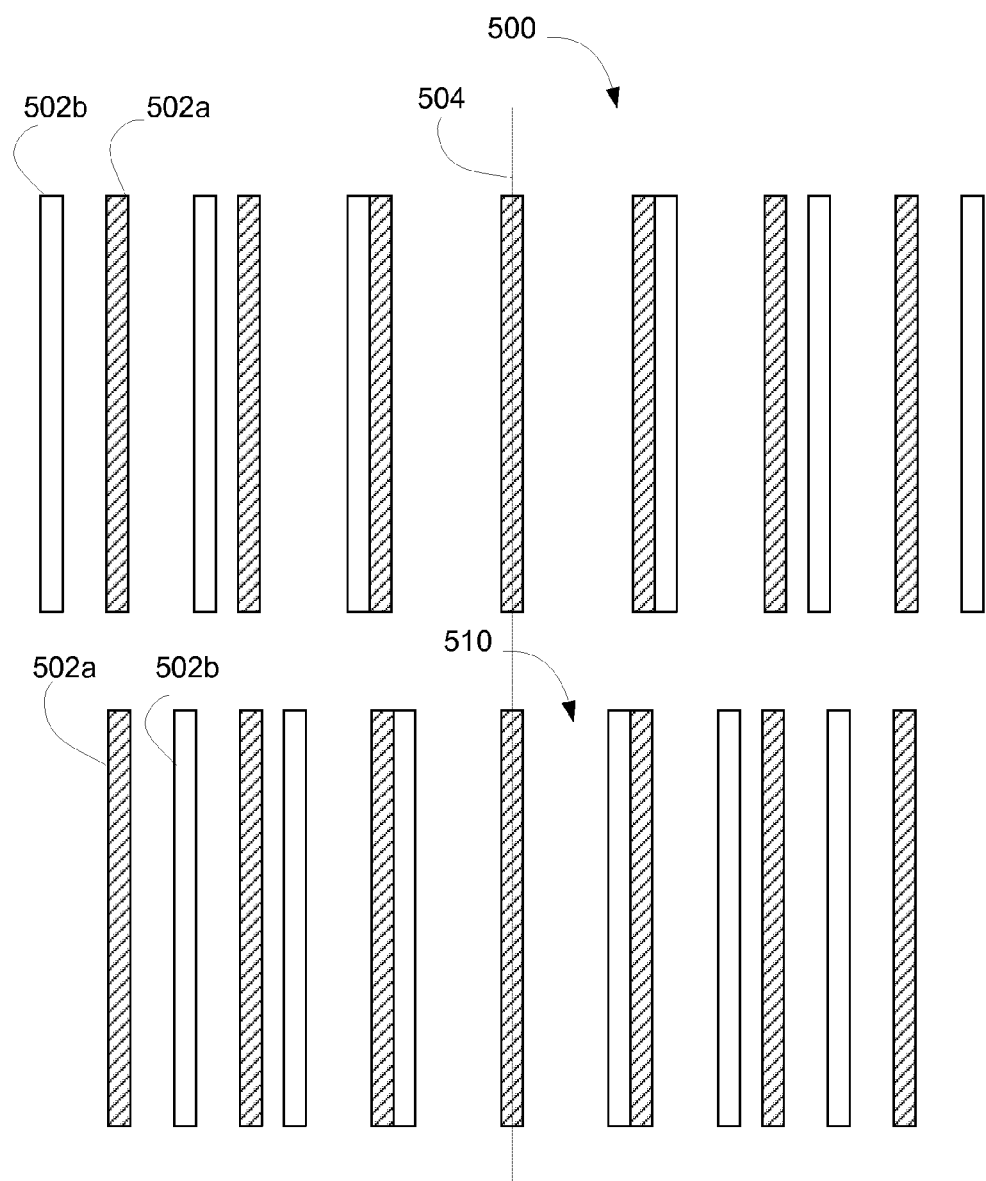
FIG. 2 is a diagram of a continuously varying offset (CVO) target in which the gain is approximately equal to $p/\Delta p$, where $\Delta p$ is the pitch difference between the top and bottom gratings.

In the case of the CVO targets shown in FIG. 2, the preset gain G is approximately equal to $p/\Delta p$, where $\Delta p$ is the pitch difference between the top and bottom gratings. FIG. 2 includes a first set of CVO marks 500 and a second set of CVO marks 510 that each includes a top grating 502a (cross hatched fill) over a bottom grating 502b (solid white fill). The first and second sets of marks are oriented in an X direction although they may be oriented in any suitable manner, such as a Y direction or both an X and Y direction, e.g., a plurality of periodic cross structures or the marks include a set of X direction periodic lines and a set of Y direction periodic lines. As shown, the two sets of CVO marks 500 and 510 are positioned on the same axis 504 (e.g., have a same X positioned center of symmetry). However, the two sets may alternatively be shifted relative to one another.

Furthermore, the gratings in the two sets of CVO marks may be configured with different offsets. One of the marks may be designed with an upper periodic structure having a smaller value of a particular attribute, such as pitch, than the lower periodic structure, and the other mark may then be designed with an upper periodic structure having a larger value of a particular attribute than the lower periodic structure. Alternatively, the two sets of marks may each have an upper periodic structure having a smaller value of a particular attribute than the lower periodic structure, or visa versa.

In the illustrated embodiment, the periodic structures are gratings, and the particular varying attribute corresponds to pitch. In the first set of targets 500, the pitch of the top grating 502a is made smaller than the pitch of the bottom grating 502b. For instance, the pitch of the top grating 502a may be 10.0% smaller than the pitch of the bottom grating 502b. As result of this difference, the offset between the upper and lower gratings 502a and 502b, respectively, varies continuously as a function of position. The second set of targets 510 has a different variation with respect to pitch. In the second set of targets, the pitch of the top grating 502a is made larger (e.g., by 10.0%) than the pitch of the bottom grating 502b.

In a CVO target example, the overlay error may be determined by dividing the distance $\Delta X$ (the distance between the centers of symmetry and of CVO marks 500 and 510) by the gain factor of the overlay target. The equation for calculating overlay error may correspond to the following:

$$OVL_{error} = \frac{\Delta X}{G} = \frac{\Delta X * (P1 - P2)}{P1}$$

where
$OVL_{error}$=the amount of misalignment between two layers,
$\Delta X$=the distance between the centers of symmetry,
P1=the value of the first pitch,
P2=the value of the second pitch, and
G=p/$\Delta$p in each of the targets of FIG. 2.

In the example target 500 or the target 510, there is no overlay error since the top and bottom gratings have a center of symmetry at a same position at axis 504. Said in another way, the center of symmetry of target 500 is the same as the center of symmetry of target 510 so as to result in $\Delta X$ value equal to zero, which causes the overlay error to equal zero.

Figure 3:
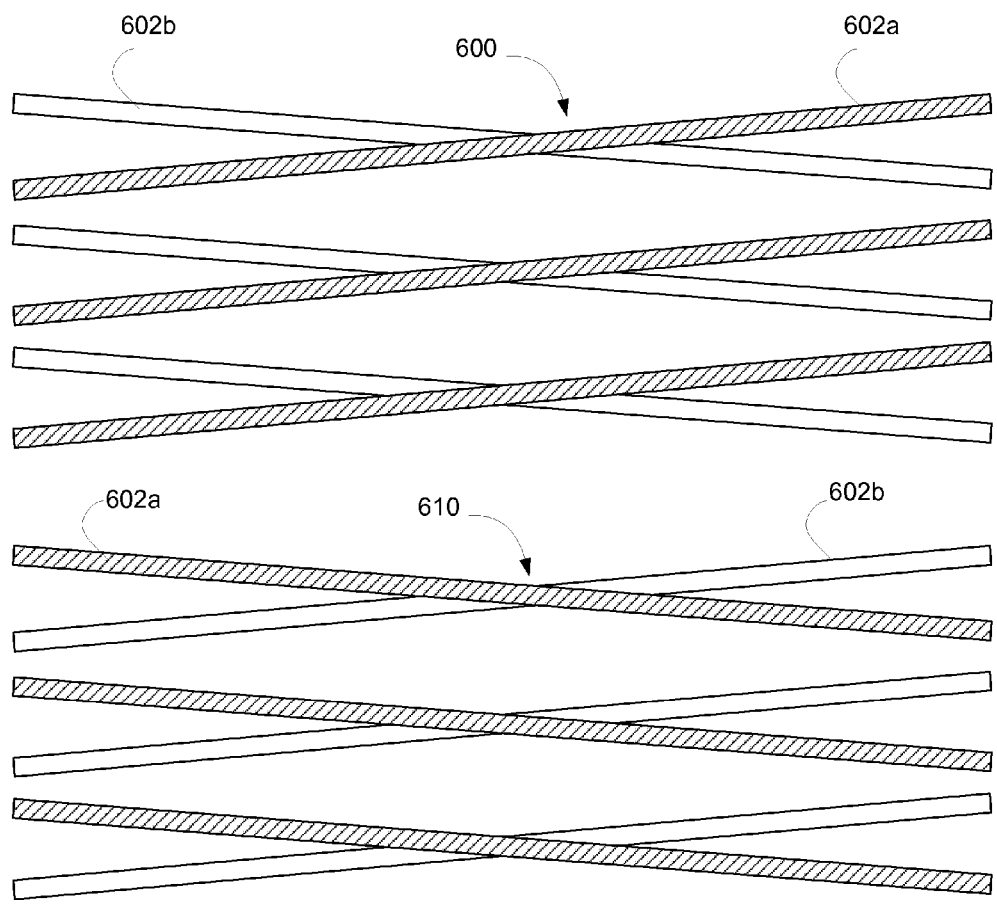
FIG. 3 is a diagram of a CVO target in which the gain is approximately equal to $1/\tan \theta$, where $\theta$ is half the angle between the top and bottom grating lines.

In the case of the CVO target shown in FIG. 3, the gain, G, is approximately equal to 1/tan θ, where θ is half the angle between the top and bottom grating lines. As shown, the overlay region includes a first set of CVO targets 600 and a second set of CVO targets 610. Each set of targets is formed as a grating-on-grating target. The gratings 602a and 602b of the two sets of targets are oriented in a Y direction. As shown, the top gratings 602a and the bottom gratings 602b of each set of targets have been rotated relative to one another (e.g., tilted y gratings). By way of example, the bottom grating may be tilted in the clockwise direction, and the upper grating may be tilted in the counterclockwise direction, or vice versa. Alternatively, only one of the gratings may be tilted. It should be noted that the angle of rotation is exaggerated in this Figure and that the rotation is typically closer to 5 degrees. Alternatively, the top and bottoms gratings of the first set of targets 600 may be tilted in an opposite direction than the top and bottom gratings of the second set of targets 610 (as seen in FIG. 3). Moreover, FIG. 3 shows the gratings when they are in perfect alignment such that the top and bottom structures at the center of symmetry are aligned.

The grating-on-grating targets may be, for example, CVO grating-on-grating targets. In these targets, there is a fine pitch of the gratings, and there is also a coarse pitch produced in the scattered light as a result of the Moiré effect. The coarse pitch is much larger than the fine grating pitch. The CVO targets can be measured in various modes in which the scattered light corresponds to certain diffraction orders of the fine pitches and different or the same diffraction orders of the course pitch produced as a result of the Moiré effect.

In one embodiment, CVO targets can be measured in a mode where the fine pitch is unresolved (only order 0 is captured), but many diffraction orders (including 0) of the coarse pitch are captured. This mode may generate low contrast, which results from the fact that multiple scattering from the top and bottom gratings may be needed for the formation of any image and because of the presence of the 0 order.

In embodiments of the present invention, however, measurements are obtained from CVO targets using only diffraction orders +n and −n (where n is an integer value and not a zero value) of the coarse pitch, and using only the 0 order for the fine pitch (e.g., the fine pitch is left unresolved). These diffraction orders +n and −n are preferably spatially coherent in order to ensure image formation. This approach enhances the contrast significantly by eliminating the 0 order. In addition, the resulting signal is a substantially, pure sinusoid (as a function of position). This type of simplified signal allows a very easy algorithmic elimination of any signal distortion due to, for example, light non-uniformity. Another advantage of this approach is that the period of the signal is reduced by a factor of n. This effect can be used to reduce target size and/or enlarge the gain factor, G, without compromise on target size.

In another embodiment, the system is used to image CVO grating-on-grating targets with diffraction orders ±n of the fine pitch and many orders, including 0 order, of the coarse pitch. Here the 0 order of the coarse pitch is captured, but because the fine pitch is resolved (with no 0 order and ±n imaging), no multiple reflection from top and bottom gratings is necessary for image formation. This greatly enhances contrast. The diffraction orders of the fine pitch are preferably incoherent in order to eliminate any bias in the measurement. Also, the optical system preferably is configured to ensure symmetry between the two captured orders (e.g., +n and −n orders).

In yet another embodiment, the system is used to image continuously varying offset (CVO) grating-on-grating targets with diffraction orders ±n of the fine pitch and orders ±m of the coarse pitch. Here, the diffraction orders of the fine pitch are incoherent, whereas those of the coarse pitch are coherent. This measurement mode simultaneously results in contrast enhancement and a simplified sinusoidal signal.

In some cases, the methods described above may suffer from reduction of total scattered light intensity. Thus, in one embodiment, an illumination system with small illumination NAs and a light source that produces light that is easily collimated may be used. For example, the light source may include a bright light source such a laser. A laser is advantageous because collimated light is sometimes required in order to prevent overlap of diffraction orders and laser light can be collimated without significant loss of intensity. Alternatively, LED's (light emitting diodes) may be used.

Additional details on overlay measurement methods and different types of grating targets that can be utilized herein are provided in: (1) U.S. Pat. No. 7,068,833 issued Jun. 27, 2006 and entitled "OVERLAY MARKS, METHODS OF OVERLAY MARK DESIGN AND METHODS OF OVERLAY MEASUREMENTS", (2) U.S. patent application Ser. No. 11/060,588, filed Feb. 16, 2005 and entitled "CONTINUOUSLY VARYING OFFSET MARK AND METHODS OF DETERMINING OVERLAY", (3) U.S. patent application Ser. No. 10/729,838 filed Dec. 5, 2003 and entitled "APPARATUS AND METHODS FOR DETECTING OVERLAY ERRORS USING SCATTEROMETRY", and (4), U.S. patent application Ser. No. 10/367,124 filed Feb. 13, 2003 and entitled "OVERLAY METROLOGY AND CONTROL METHOD", all of which are herein incorporated by reference.

Figure 4:
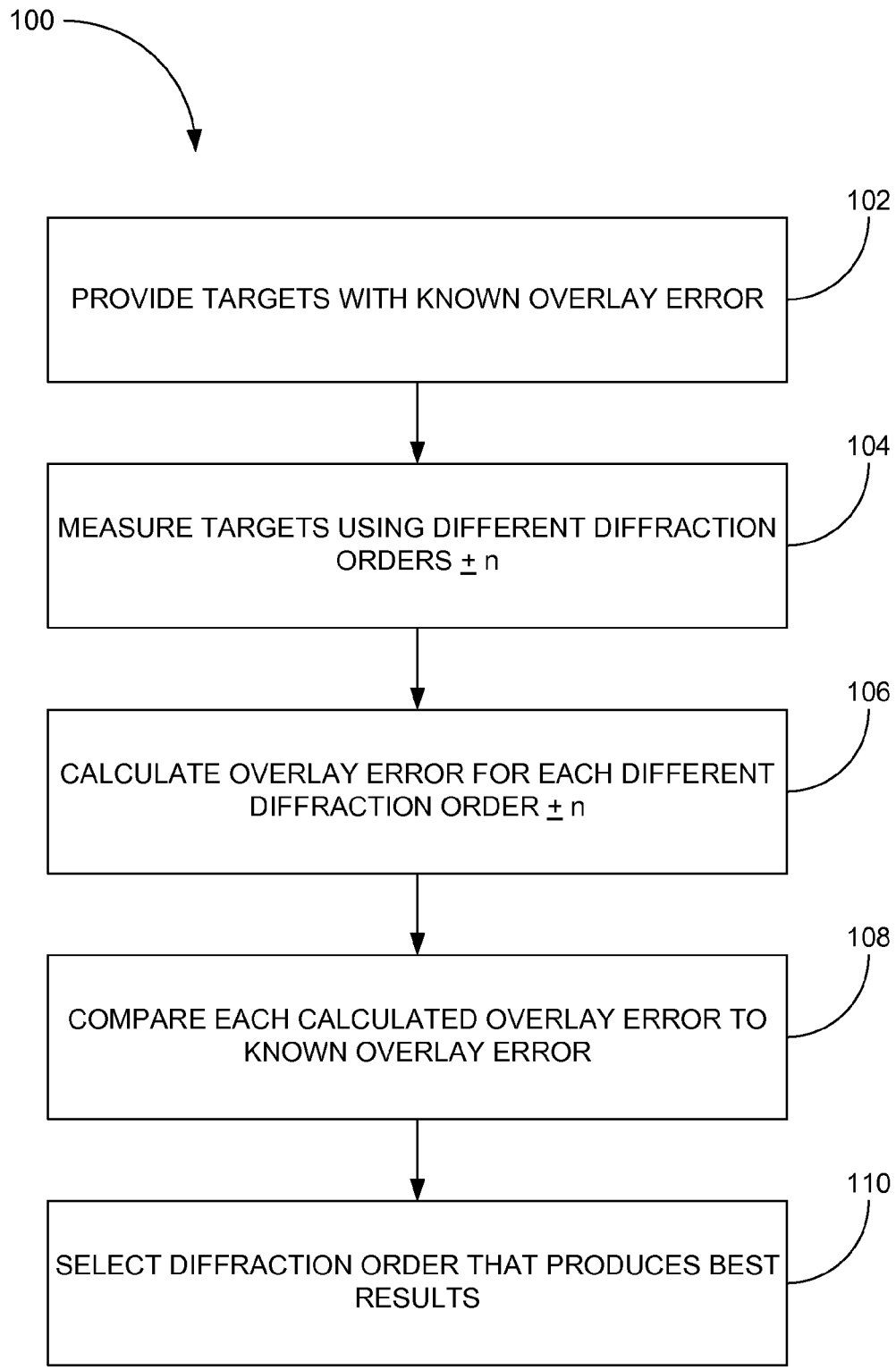
FIG. 4 is a flowchart illustrating a procedure of determining which diffraction orders produce the best results for a given target design, in accordance with one embodiment of the present invention.

FIG. 4 is a flowchart illustrating a procedure 100 of determining which diffraction orders produce the best results for a given target design, in accordance with one embodiment of the present invention. As shown, a target with a known overlay error is provided in operation 102. The provided target is then measured using different diffractive orders ±n in operation 104. The overlay error is calculated for each different diffractive order ±n in operation 106. Each calculated overlay error is compared to the known overlay error in operation 108. The comparison is used to select which diffraction order ±n produces the most advantageous result in operation 110. For example, the optimal diffraction order ±n for the given target can be extracted from the measured overlay error that most closely matches the known overlay error.

Figure 5:
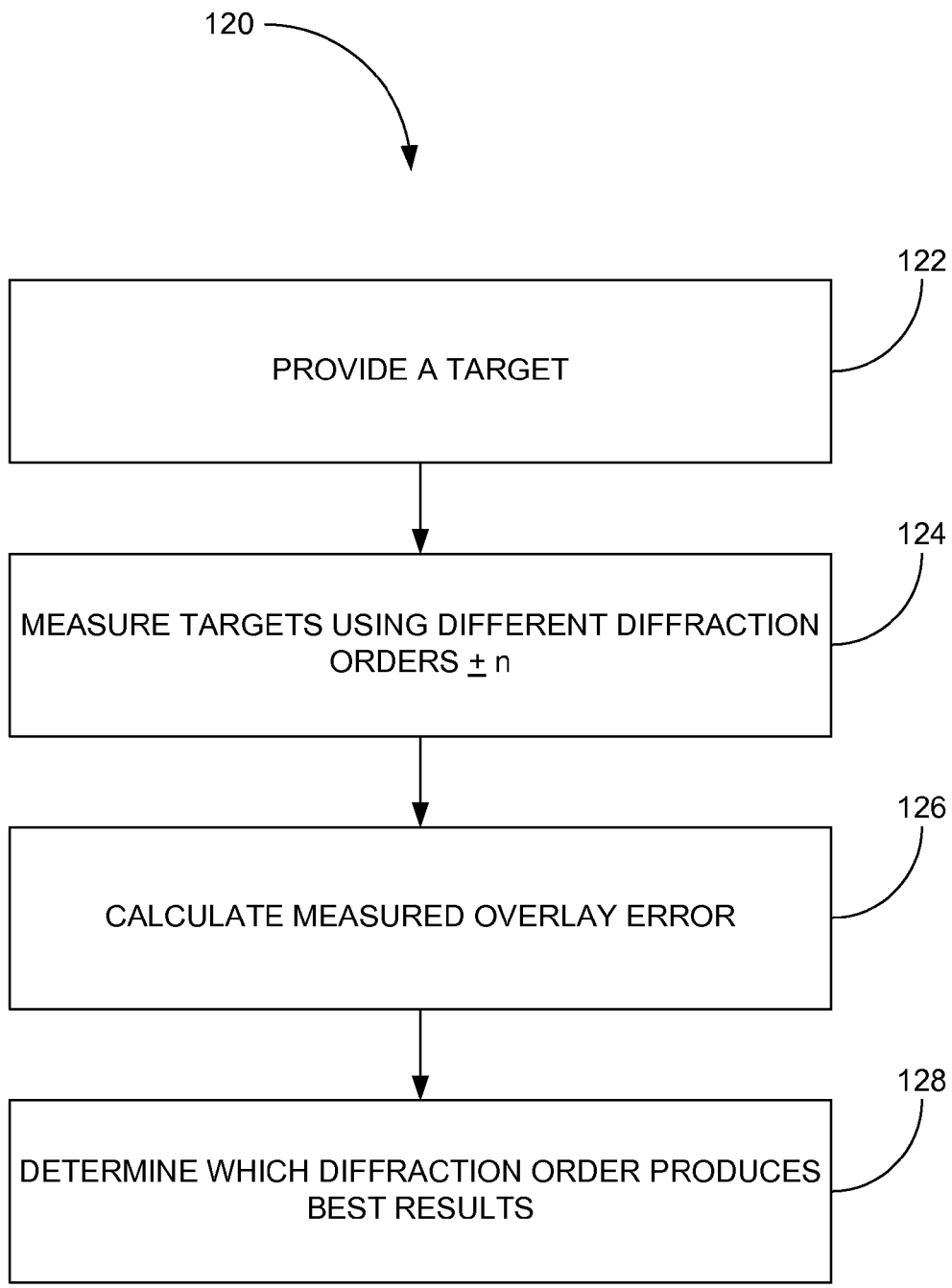
FIG. 5 is a flowchart illustrating a procedure of determining which diffraction orders produce the best results for a given target design, in accordance with another implementation of the present invention.

FIG. 5 is a flowchart illustrating a procedure 120 of determining which diffraction orders produce the best results for a given target design, in accordance with another implementation of the present invention. A specific target is initially provided in operation 122. The specific target is then measured using different diffractive orders ±n in operation 124. The overlay error for the target is calculated for each measurement in operation 126. A determination is then made as to which diffraction order produces the most accurate overlay results in operation 128. For example, each of the measured overlay errors can be compared with a known overlay error. This method can also be performed for varying process parameters to determine best diffraction order for each set of process parameters.

Figure 6:
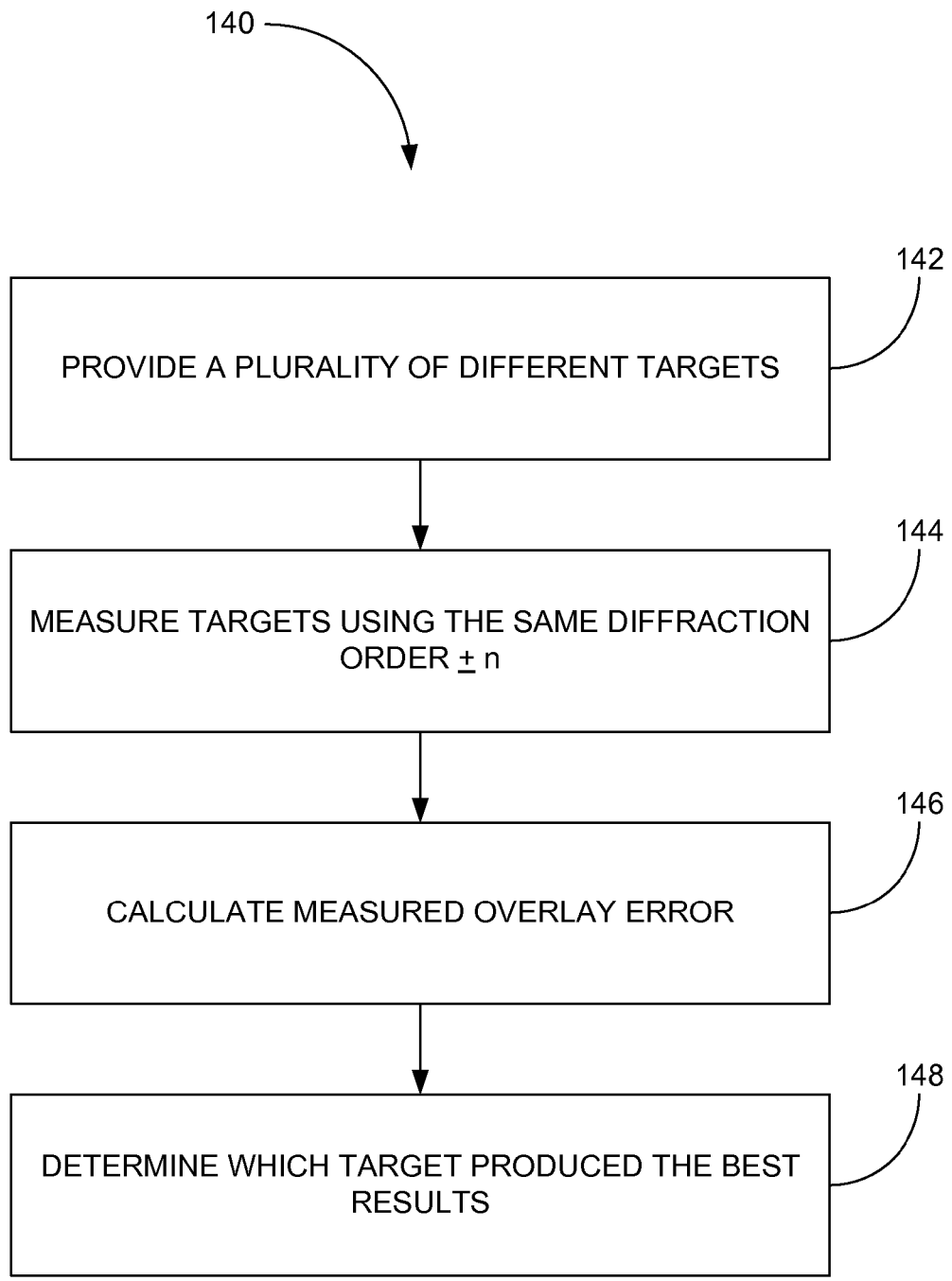
FIG. 6 is a flowchart illustrating a procedure of determining which target from a set of targets produce the best results for a given diffraction order ±n, in accordance with an alternative implementation of the present invention.

FIG. 6 is a flowchart illustrating a procedure 140 of determining which targets produce the best results for a given diffraction order ±n, in accordance with an alternative implementation of the present invention. A plurality of different targets is initially provided (for a given set of process parameters) in operation 142. Each of the different targets is measured using the same diffraction orders ±n in operation 144. The overlay error for each of the different targets is calculated in operation 146. It is then determined as to which target produces the most accurate overlay results for a specific diffraction order in operation 148. This method can be performed for varying process parameters to determine best diffraction order/target combination for each set of process parameters.

Figure 7:
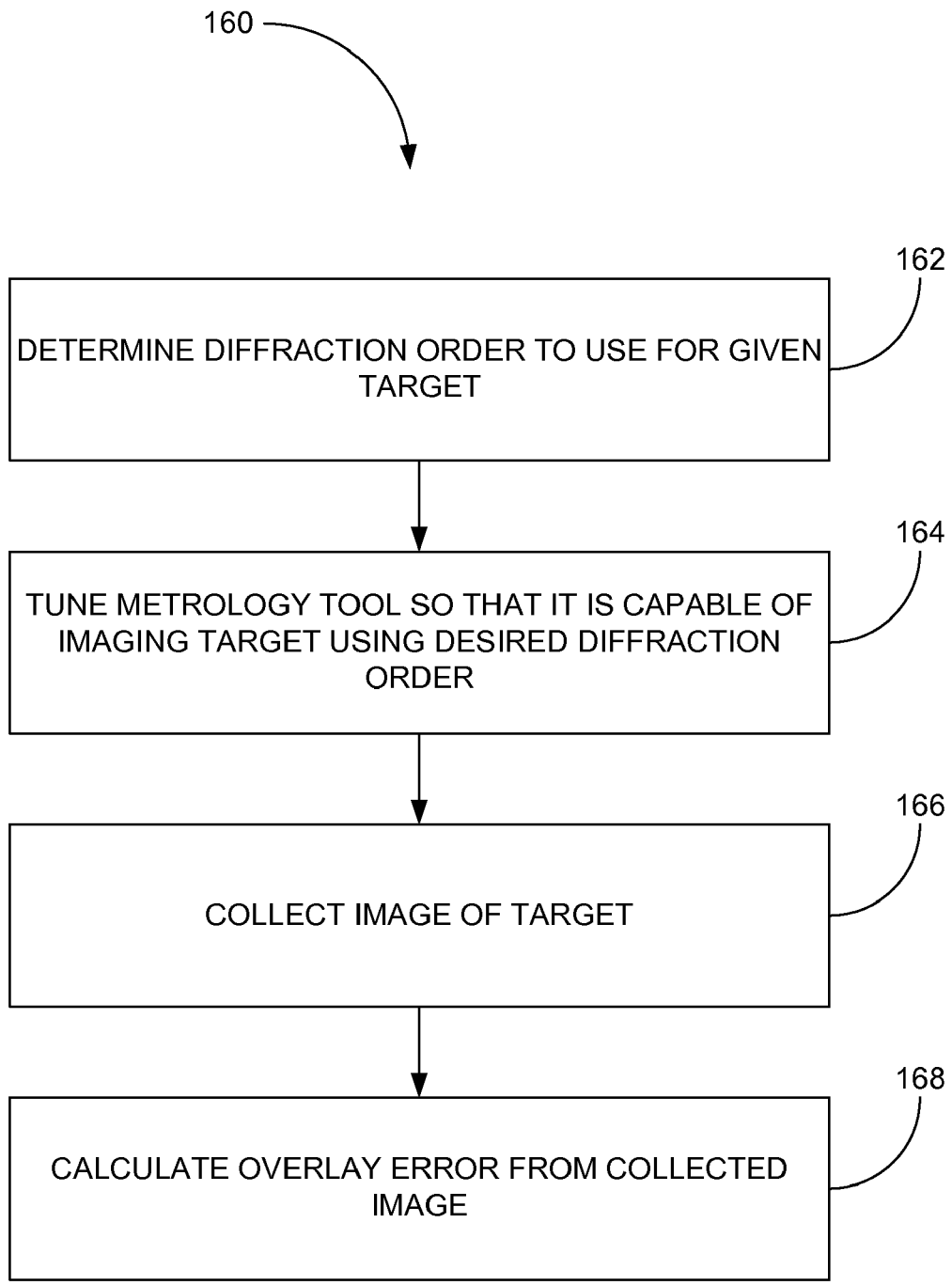
FIG. 7 is a flowchart illustrating a procedure of determining overlay error, in accordance with one embodiment of the present invention.

FIG. 7 is a flowchart illustrating a procedure 160 of determining overlay error, in accordance with one embodiment of the present invention. The method may, for example, be performed for a production run. A set of diffraction orders for using with a given target may initially be determined in operation 162. This may, for example, be accomplished through pre-production testing as described with respect to FIGS. 4, 5, or 6 or a combination of same. For instance, a target with a certain pitch may require imaging at a specific diffraction order. In general, overlay error may be determined for a given target configuration based on optical measurements with different diffraction orders, and it is then determined which one of these different diffraction orders is more advantageous (e.g., matches a known overlay error more accurately).

For example, the diffraction order that provides the best contrast and the simplest signal with minimum light loss may be selected. In most cases, the lower diffraction orders produce higher intensities. Thus, orders closer to 0 order may be preferred (e.g., orders ±1, ±2, ±3). However, in some cases, a higher order may have a higher light intensity than a lower order. For example, there may be some cases where ±2 has a higher intensity than ±1. This result may be caused by, for example, the way the stack that is being imaged is configured.

Referring back to FIG. 7, after one or more diffraction order(s) are determined, the metrology tool may be tuned so that it is capable of imaging a target at the desired diffraction order, e.g., ±n orders, in operation 164. For example, if the desired diffractive orders are ±1, then the metrology tool is set up to enable imaging of only the ±1 diffraction orders. By way of example, ±1 diffraction orders may be allowed to be transmitted through to the sensor, while other diffraction orders are blocked.

Furthermore, the illumination NA may be configured to be small in order to provide good separation angles between orders. For example, if the angles of +1 and +2 are similar then differentiating them may be difficult (e.g., unable to select one or the other). For instance, an illumination NA of between about 0.05 and about 0.2 may be used.

After the metrology tool is tuned, an image may then be collected from the target at the desired diffraction orders and the overlay error may then be calculated from the image of the target in operation 166 and 168, respectively. The calculated overlay error may be stored (e.g., in memory or any suitable computer readable storage medium) and presented for using for any suitable purpose, such as a procedure for correcting a lithography system. Any method suitable for calculating overlay error may be used. Some methods may be better suited for specific targets, specific set of process conditions, specific diffraction orders and the like. Several techniques for determining overlay error are presented in the above referenced U.S. patent applications and patent.

Figure 8:
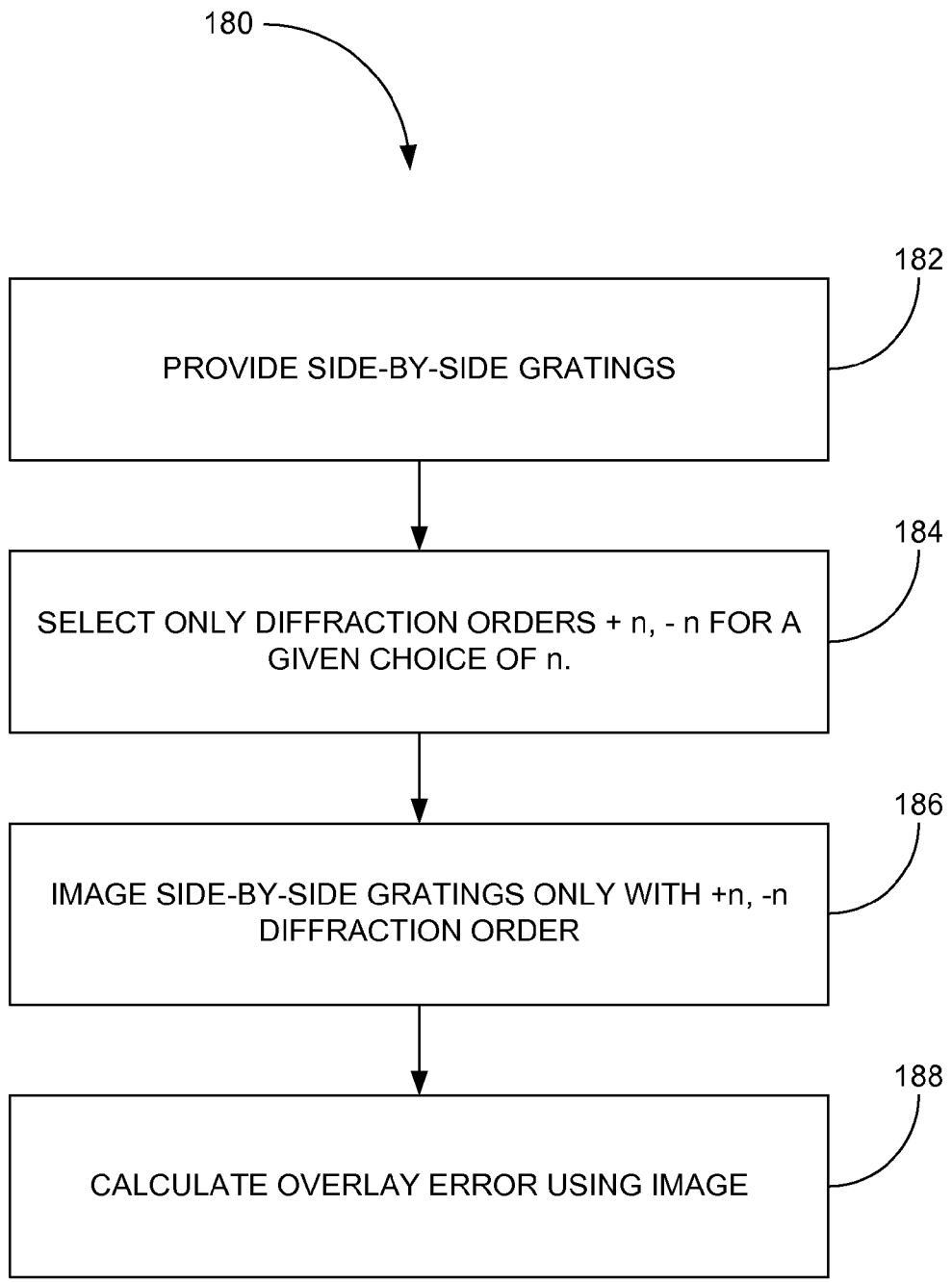
FIG. 8 is flowchart illustrating a procedure of measuring overlay using a side-by-side gratings target, in accordance with an alternative embodiment of the present invention.

FIG. 8 is flowchart illustrating a procedure 180 of measuring overlay using a side-by-side gratings target, in accordance with an alternative embodiment of the present invention. Side-by-side gratings may be initially provided in operation 182. Diffraction orders ±n for a given choice of n may then be selected in operation 184. The side-by-side gratings may then be imaged with only the selected ±n diffraction order (0 order is not collected) in operation 186. The image may then be used to calculate overlay error in operation 188. One advantage of this method is significant improvement in contrast.

Figure 9:
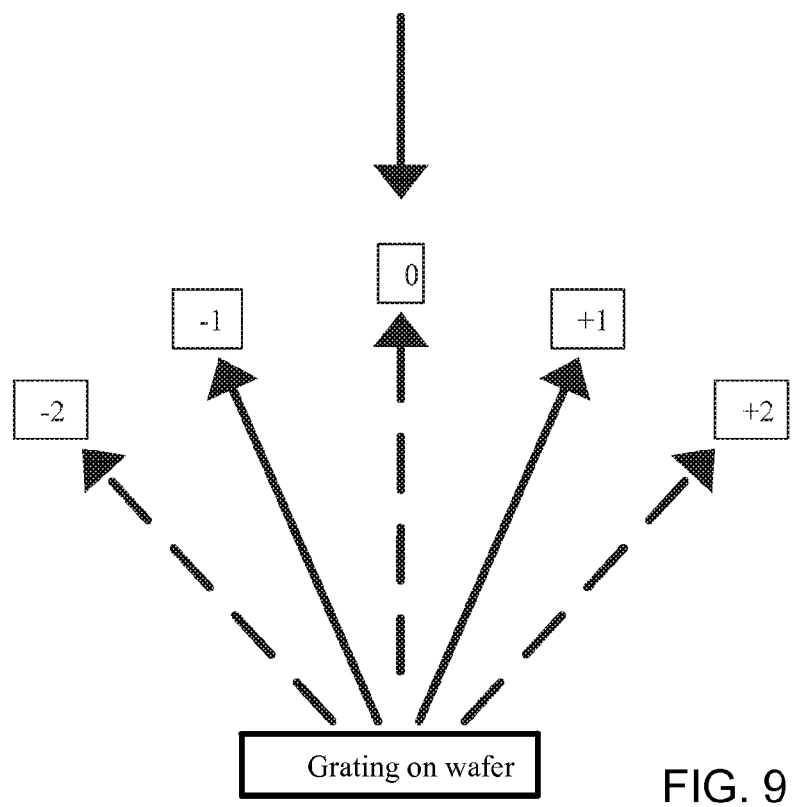
FIG. 9 is a diagram of an example of imaging using a given pair of ±n diffraction orders generated from side-by-side gratings.

FIG. 9 is a diagram of an example of imaging using a given pair of ±n diffraction orders generated from side-by-side gratings. The solid incoming arrow (pointing downwards) corresponds to the direction of illumination rays. The solid outgoing arrows (pointing upwards) correspond to the direction of diffracted rays used for imaging. The dashed outgoing arrows (pointing upwards) correspond to the direction of blocked diffracted rays. The numbers in the boxes corresponds to order numbers of diffracted rays. In this example, the scattered light from the gratings is imaged using only the ±1 diffraction orders.

Figure 10:
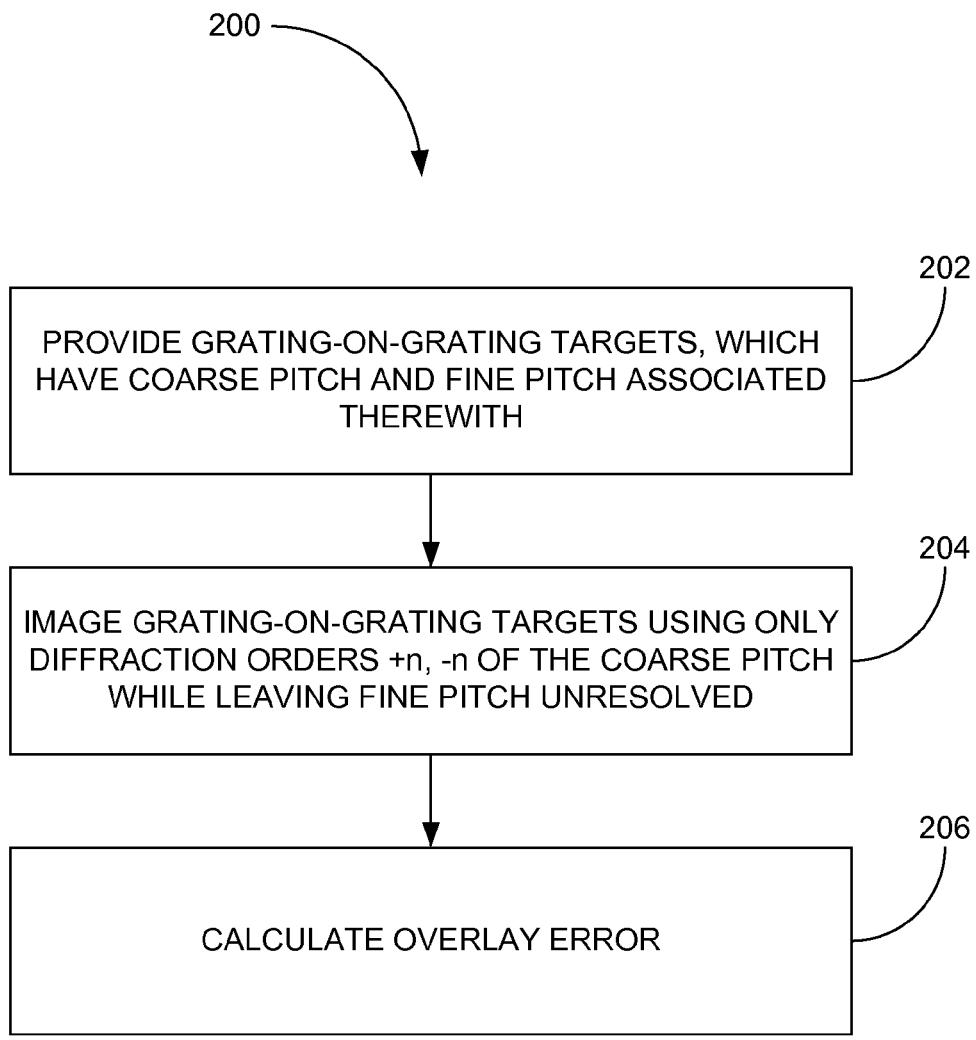
FIG. 10 is a flowchart illustrating a procedure of measuring overlay using a grating-on-grating target, in accordance with one embodiment of the present invention.

FIG. 10 is a flowchart illustrating a procedure 200 of measuring overlay using a grating-on-grating target, in accordance with one embodiment of the present invention. Grating-on-grating targets, which have a coarse pitch and a fine pitch associated with the light scattered there from, may be initially provided in operation 202. The grating-on-grating targets may be, for example, CVO grating-on-grating targets. In the scattered light, there are diffraction orders associated with the fine pitch of the grating and there are also diffraction orders associated with a coarse pitch based on Moiré effect. The coarse pitch is much larger than the fine grating pitch.

The grating-on-grating targets may be imaged using only the ±n diffraction orders of the coarse pitch while leaving the fine pitch unresolved in operation 204. These diffraction orders are preferably spatially coherent in order to ensure proper image formation. In essence, the pitch of the grating is left unresolved and only the Moiré grating is resolved.

The image at the selected ±n diffraction orders may then be used to calculate overlay error in operation 206. One advantage of this method can be a very significant improvement in contrast. Another advantage is the simplicity of the signal, which as a result can enable elimination of signal distortions due to, for example, non-uniform illumination.

Figure 11:
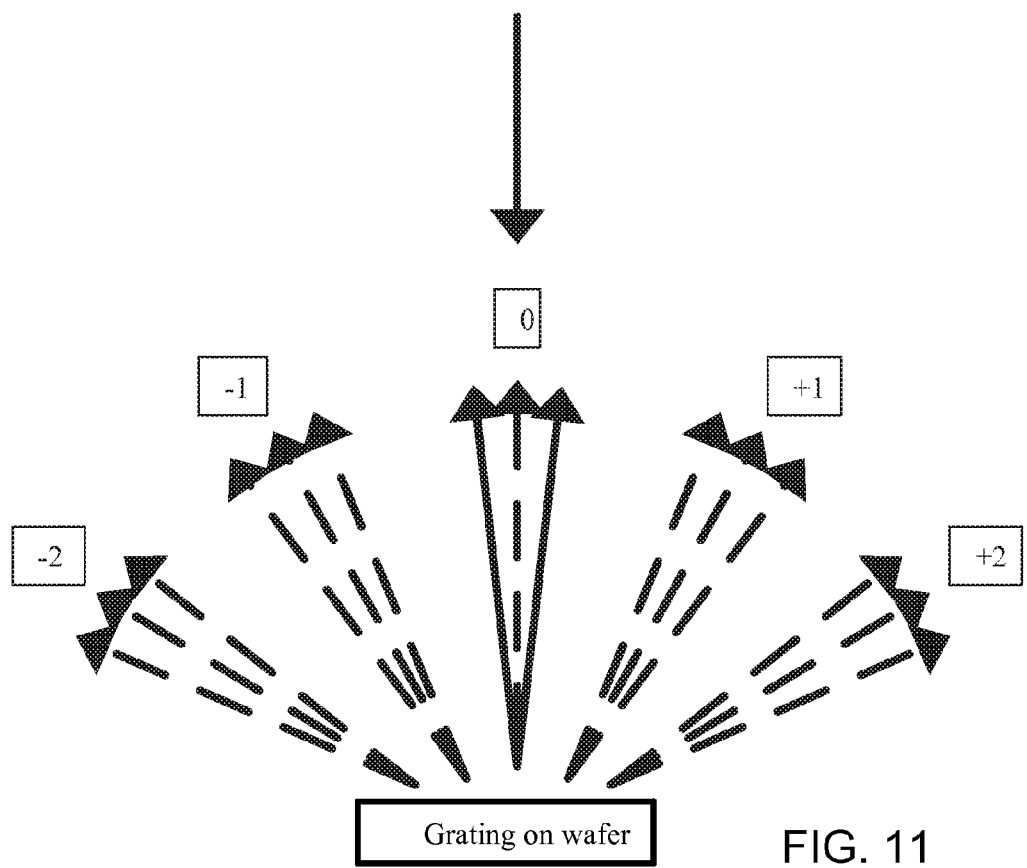
FIG. 11 is a diagram of diffraction orders generated with grating-on-grating targets with diffraction orders based on coarse pitch and fine pitch.

FIG. 11 is a diagram of diffraction orders generated with grating-on-grating targets with diffraction orders based on coarse pitch and fine pitch. The solid incoming arrow (pointing downwards) corresponds to the direction of illumination rays. The solid outgoing arrows (pointing upwards) correspond to the direction of diffracted rays used for imaging. The dashed outgoing arrows (pointing upwards) correspond to the direction of blocked diffracted rays. The numbers in the boxes corresponds to fine pitch order numbers of diffracted rays. Each fine pitch diffracted order is split into rays which correspond to different course pitch diffracted orders. As shown, only the ±n diffraction orders of the course pitch from the bundle or rays corresponding to the 0 order of the fine pitch are imaged. Therefore, the fine pitch is unresolved in this example.

Figure 12:
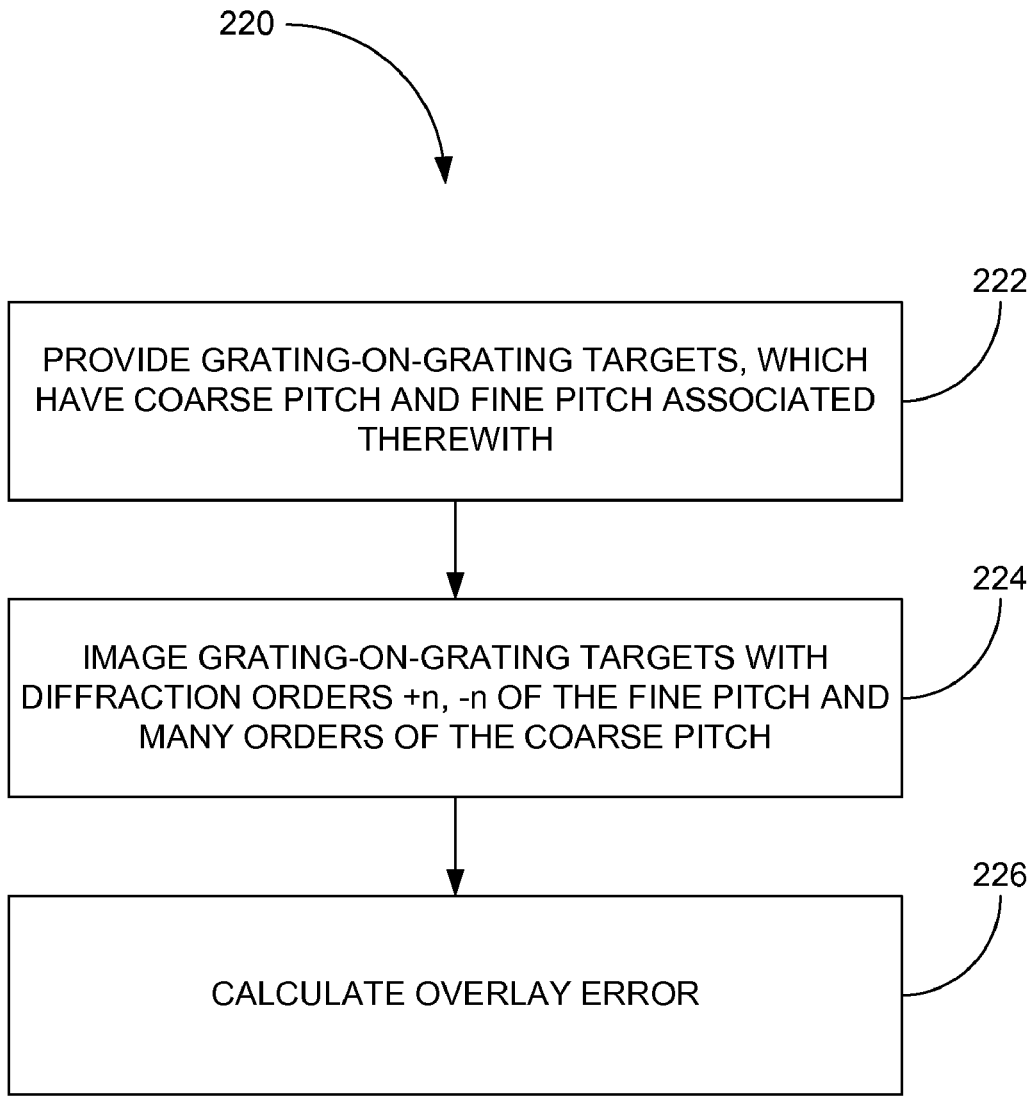
FIG. 12 is a flowchart of a procedure of measuring overlay using a grating-on-grating target, in accordance with an alternative embodiment of the present invention.

FIG. 12 is a flowchart of a procedure 220 of measuring overlay, in accordance with one embodiment of the present invention. Grating-on-grating targets, which have a coarse pitch and a fine pitch associated therewith, may initially be provided in operation 222. The grating-on-grating targets may then be imaged using only diffraction orders ±n of the fine pitch and many orders, including 0 order, of the coarse pitch in operation 224. Here, the 0 order of the coarse pitch is captured, but because the fine pitch is resolved, no multiple reflections from the top and bottom gratings is necessary for image formation. The diffraction orders of the fine pitch are preferably incoherent in order to eliminate any bias in the measurement. Also, the optical system is preferably configured so as to ensure symmetry between the two captured orders. The image may then be used to calculate overlay error in operation 226. One advantage of this method can be a very significant improvement in contrast.

Figure 13:
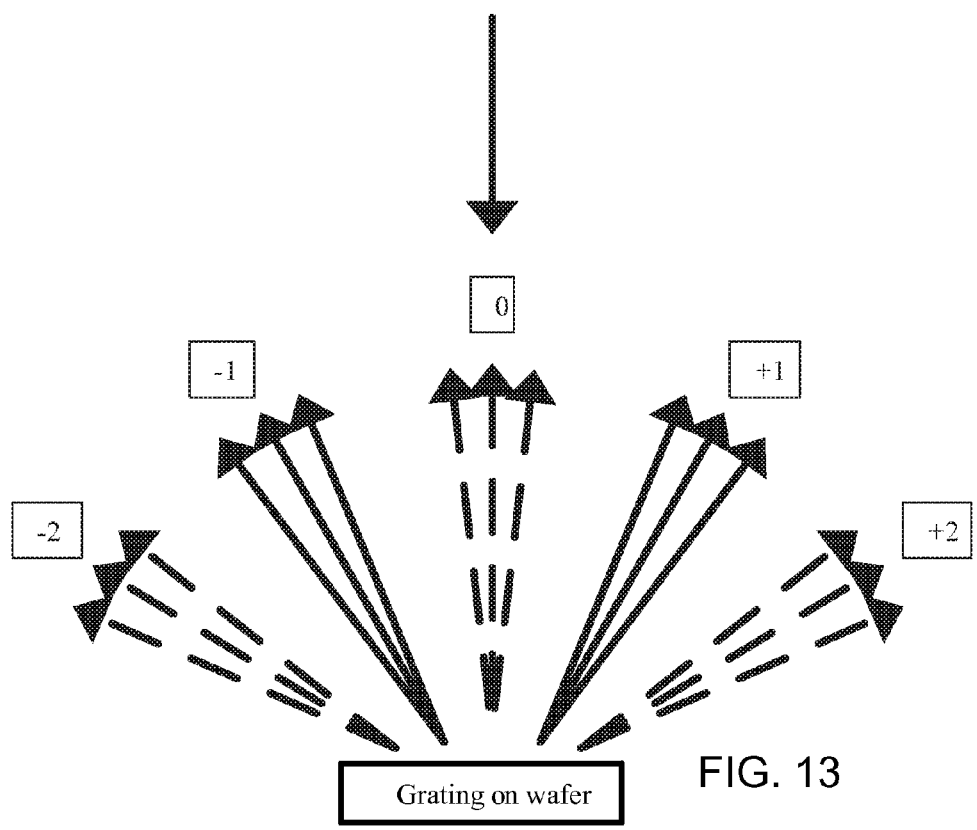
FIG. 13 is a diagram of diffraction orders generated with grating-on-grating targets with diffraction orders based on coarse pitch and fine pitch.

FIG. 13 is a diagram of diffraction orders generated with grating-on-grating targets with diffraction orders based on coarse pitch and fine pitch. The solid incoming arrow (pointing downwards) corresponds to the direction of illumination rays. The solid outgoing arrows (pointing upwards) correspond to the direction of diffracted rays used for imaging. The dashed outgoing arrows (pointing upwards) correspond to the direction of blocked diffracted rays. The numbers in the boxes corresponds to fine pitch order numbers of diffracted rays.

Figure 14:
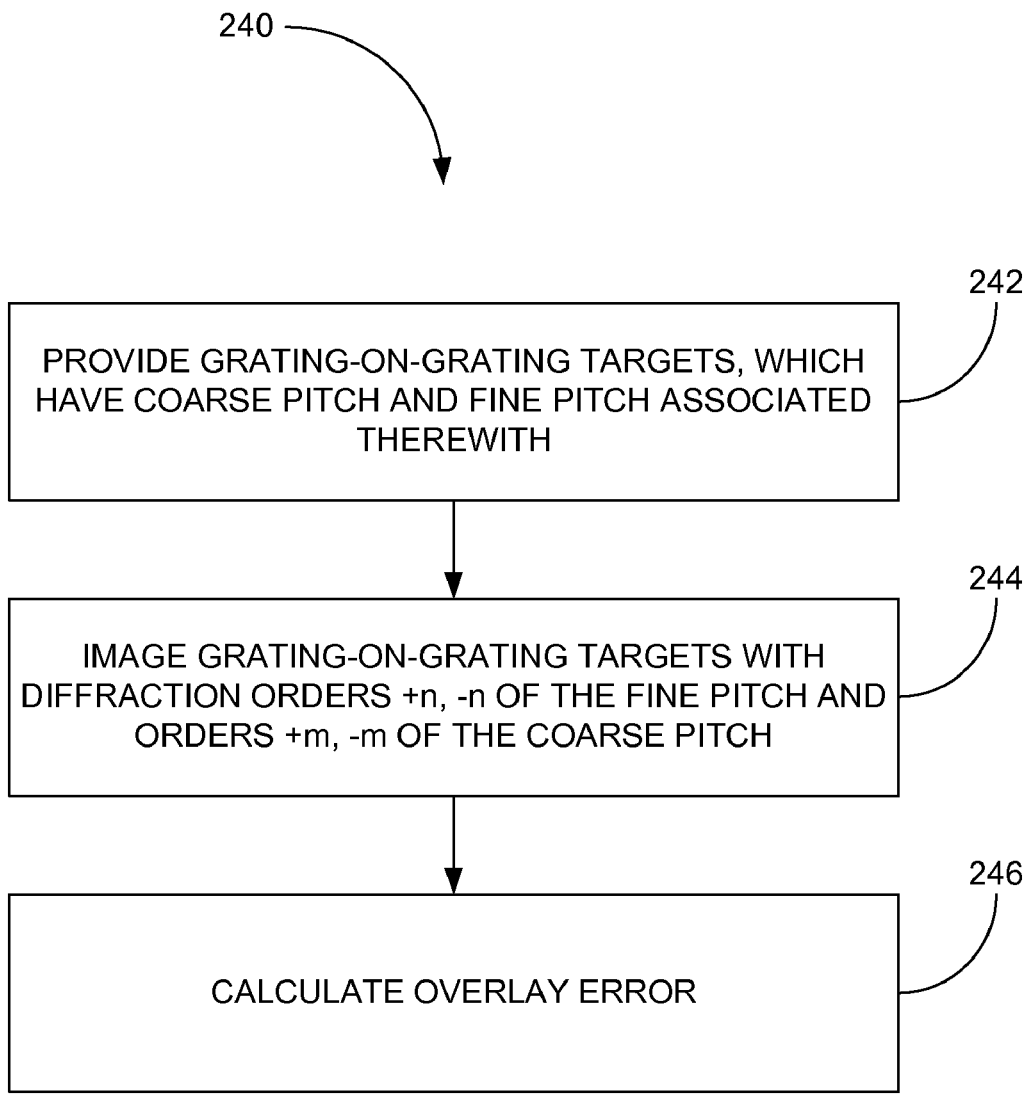
FIG. 14 is a flowchart illustrating a procedure of measuring overlay, in accordance with one embodiment of the present invention.

FIG. 14 is a flowchart illustrating a procedure 240 of measuring overlay, in accordance with one embodiment of the present invention. Grating-on-grating targets, which have a coarse pitch and a fine pitch associated therewith, may be initially provided in operation 242. The grating-on-grating targets may then be imaged using only diffraction orders ±n of the fine pitch and diffraction orders ±m of the coarse pitch, where n is an integer that is not equal to zero and may or may not differ from m, which is also an integer that is not equal to zero. Here, the diffraction orders of the fine pitch are also preferably incoherent, whereas those of the coarse pitch within the same bundle of rays of a given fine pitch order should be coherent. The captured image may then be used to calculate overlay error in operation 246. One advantage of this method may be a very significant improvement in contrast. Another advantage is the simplicity of the signal, which as a result may enable elimination of signal distortions due to such things as non-uniform illumination.

Figure 15:
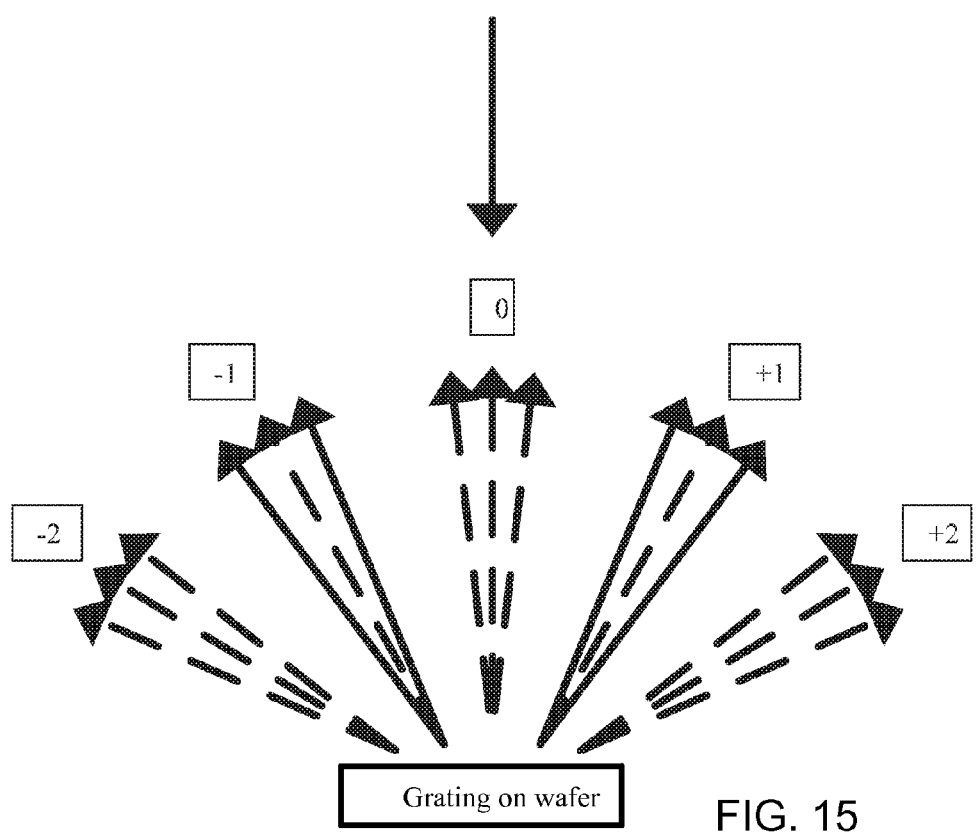
FIG. 15 is a diagram of diffraction orders generated with grating on grating targets with diffraction orders based on coarse pitch and fine pitch.

FIG. 15 is a diagram of diffraction orders generated with grating-on-grating targets with diffraction orders based on coarse pitch and fine pitch. The solid incoming arrow (pointing downwards) corresponds to the direction of illumination rays. The solid outgoing arrows (pointing upwards) correspond to the direction of diffracted rays used for imaging. The dashed outgoing arrows (pointing upwards) correspond to the direction of blocked diffracted rays. The numbers in the boxes corresponds to fine pitch order numbers of diffracted rays. As shown, the solid outgoing arrows correspond to +1 and −1 orders of the course pitch in the bundle of rays which correspond to fine pitch orders +1 and −1.

Embodiments of the present invention provide imaging of an overlay target using selected diffraction orders. In certain implementations as described above, selection of diffraction orders is accomplished by positioning one or more spatial modulation devices in the exit pupil plane of the particular optical system. However, in particular optical systems, the exit pupil plane may be inaccessible for easy placement of spatial modulation devices. For instance, the exit pupil may be located within the objective. In this case, relay optics may be used to generate a conjugate plane for the exit pupil so that such conjugate exit pupil is positioned at an accessible position. Nevertheless, one may wish to build an optical system with an inaccessible exit pupil plane for a number of reasons. For example, relay optics may be associated with additional cost, complexity, system size and weight.

Accordingly, it may be desirable to configure a metrology tool so that the exit pupil remains inaccessible. In such a system, a tunable spatial modulation device may instead be placed at an accessible plane that is positioned at a location that is closest to the exit pupil, but not at the exit pupil. That is, the modulation device is positioned at an "approximate pupil plane".

Figure 16:
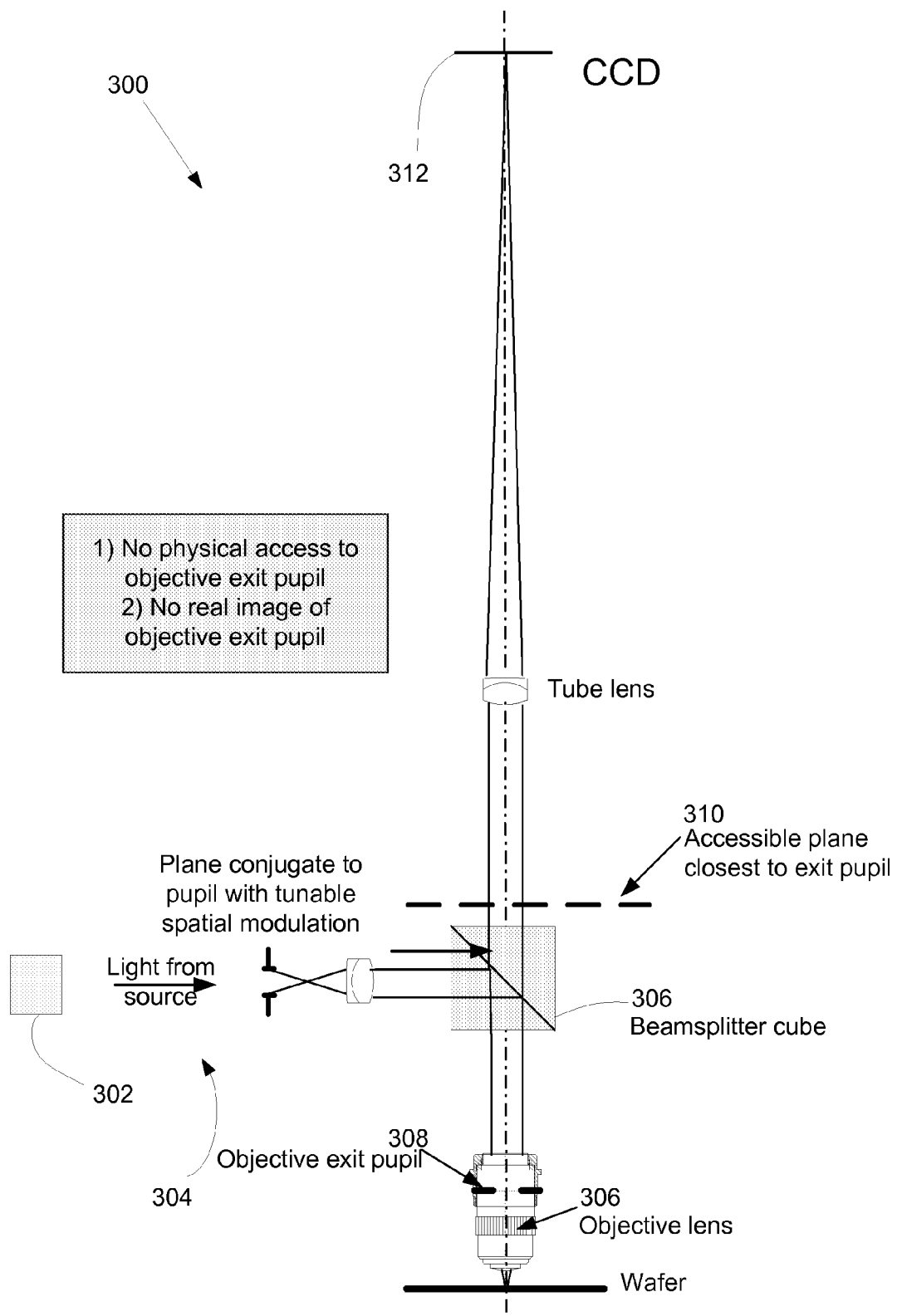
FIG. 16 is a diagrammatic representation of a metrology system having an inaccessible exit pupil in accordance with an alternative implementation of the present invention.

FIG. 16 is a diagrammatic representation of a metrology system 300 having an inaccessible exit pupil in accordance with an alternative implementation of the present invention. As shown, the system 300 includes a light source 302 for directing illumination light towards a sample (e.g., wafer). This system 300 may include components that are similar to the components of the system of FIG. 1. However, this system 300 has an objective exit pupil 308 that is inaccessible and is not relayed via relay optics to a conjugate pupil plane. Instead, this system 300 includes an accessible plane 310 at a position that is closest to the exit pupil. A tunable spatial modulation device may be placed at this accessible plane so as to image selected diffracted orders ±n on sensor 312 as described herein.

In the illustrated embodiment, the accessible plane 310 is located just after the beam splitter cube 306 in this system 300 so as to not affect the illumination path. Of course, the positioning of the accessible plane is dependent on a number of factors, such as size of the spatial modulation device and the design of the particular optics of the metrology tool.

Figure 17A:
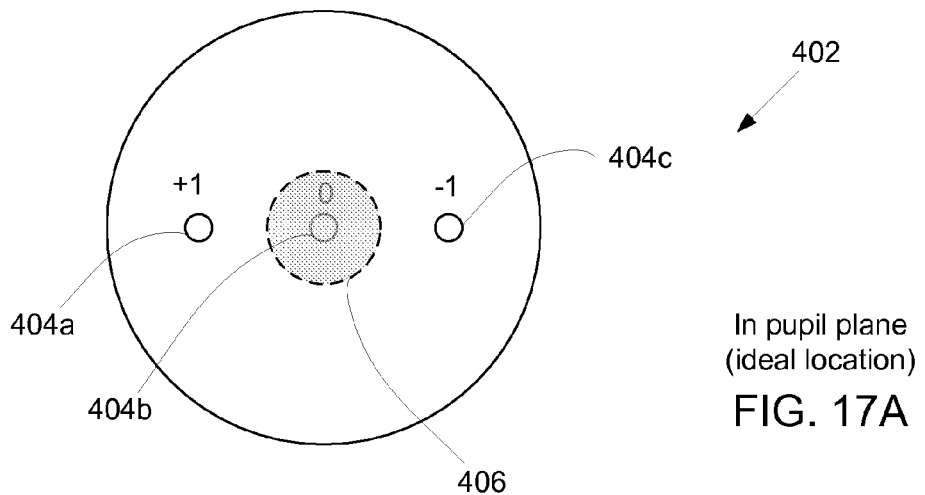
FIGS. 17A through 17C illustrate mechanisms for selecting specific diffraction orders in accordance with various embodiments of the present invention.
Figure 17B:
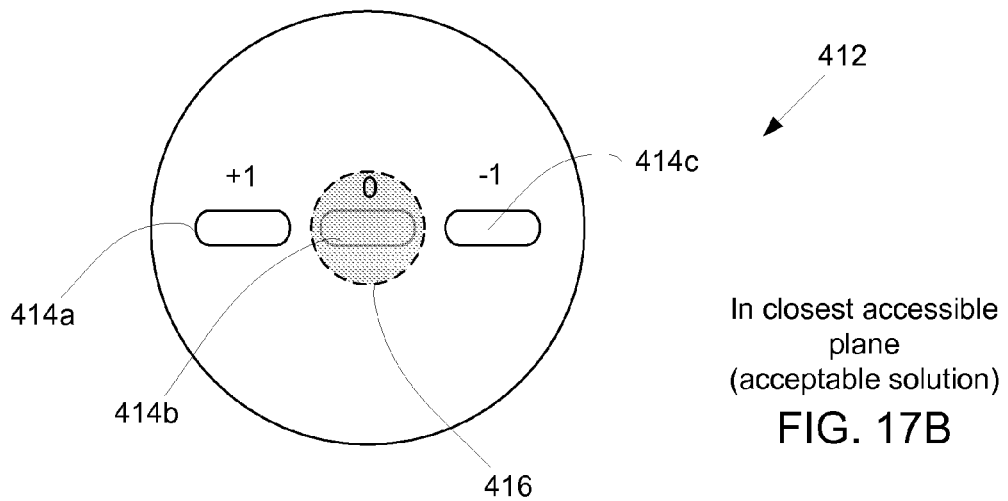
Figure 17C:
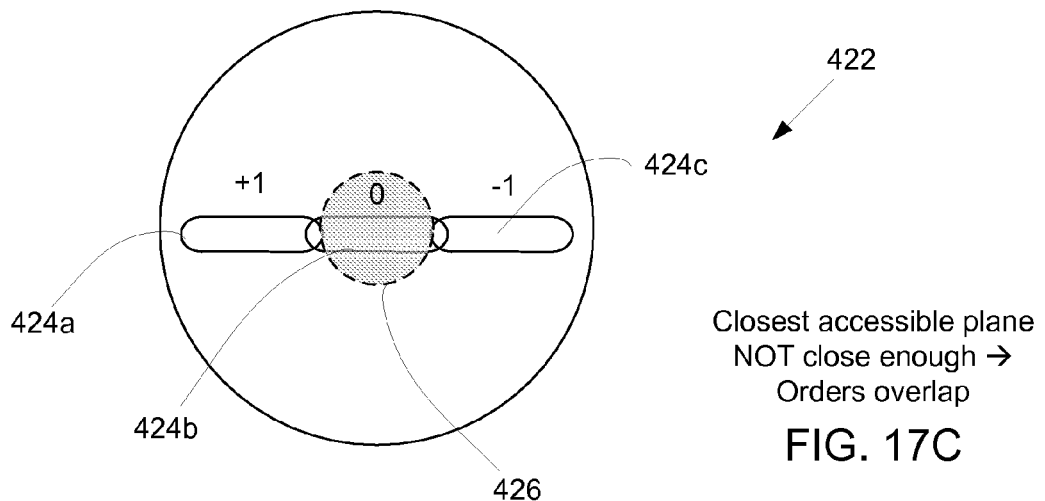

FIGS. 17A through 17C illustrate mechanisms for selecting specific diffraction orders in accordance with various embodiments of the present invention. FIG. 17A shows placement of a spatial modulation device 406 at the exit pupil plane 402. The spatial modulation device is configured to block and allow specified ones of the plurality of diffraction orders 404a~c of the scattered light emitted from the sample. As shown, the 0 order 404b is blocked by the spatial modulation device, while the +1 order 402a and −1 order 402c are allowed to transmit through the pupil plane and reach the sensor (not shown). Alternatively, the spatial modulation device may be configured to block the entire exit pupil plane except for the +1 and −1 orders 402a and 402b.

FIG. 17B illustrates the closest accessible plane 412 (e.g., plane 310 of FIG. 16). As shown, the diffraction orders 414a~414c are still acceptably separated so that specified orders can be blocked or allowed. Although the diffraction orders 414a~414c are less compact than at the ideal exit pupil location, selected diffraction orders can still be adequately blocked or allowed by a modulation device 416. As shown, the 0 order 414b is blocked from reaching a sensor, while the +1 order 414a and the −1 order 414c are allowed to reach such sensor.

FIG. 17C illustrates an accessible plane 422 that is not located close enough to the exit pupil so that the diffraction orders 424a~424c are not well separated. In the illustrated case, it would be difficult to block and allow specified diffraction orders. For example, modulation device 426 may be configured to block some, but not all, of the 0 order 424b and allow some, but not all, of the +1 order 424a and −1 order 424c. In this case, it would be difficult to block and allow specified diffraction orders.

Thus, it is desirable to place the modulation device at a position that is close enough to the exit pupil to allow blocking of substantially all of one or more selected diffracted order(s) while allowing substantially all of other selected diffraction orders to reach a sensor. The degree of separation of the diffraction orders depends on the wavelength of the light used, the optics configuration, the size of the modulation device, and the pitch of the particular targets. Thus, the wavelength and optics configuration of the metrology tool are preferably chosen so as to provide sufficient order separation for allowing spatial modulation of such orders, while the spatial modulation device is placed as close as physically possible to the exit pupil.

In specific implementations, the modulation device takes the form of a glass plate having several chrome-on-glass patterns (or other suitable material, besides chrome). Each of the patterns can be arranged to select a subset of diffraction orders at a particular accessible plane location (e.g., after the beam splitter cube). The glass may be moved and/or rotated in directions perpendicular to the accessible plane so as to position the patterns to block undesired diffraction orders and to position the unpatterned portions to allow the desired diffraction orders.

The glass may also be coated with an anti-reflective material in order to reduce reflections from the glass, and can be tilted so that the residual reflections are directed out of the optical system. Additionally, the modulation device areas in which it is intended for the diffracted orders to pass through may be drilled though so as to provide apertures at such locations so that the glass will not affect the desired diffracted orders. The chrome patterns may also be modified to perform an apodization function rather than order selection. In another embodiment, other approaches instead of chrome-on-glass may be used for the modulation device. By way of examples, a liquid crystal transmissive or reflective pixellated element or a DMD (digital micro-mirror device) may be used. For a reflective approach, the geometry of the optics may need to be modified so as to increase the quality of the reflective surface of the modulation device.

The techniques of the present invention may be implemented in any suitable combination of software and/or hardware system. Regardless of the system's configuration, it may employ one or more processors for controlling various components of the system and analyzing output images and signals detected with such system. The system also includes one or more memories or memory modules configured to store data, program instructions for the general-purpose inspection operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as air, optical lines, electric lines, etc. Examples of program instructions include both machine code, such as produced by a compiler, and files containing higher level code that may be executed by the computer using an interpreter.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An optical apparatus for measuring a characteristic of a semiconductor target, comprising:
    an illumination system for generating and directing illumination rays towards a semiconductor target via an illumination path; and
    an imaging system for directing light scattered from the semiconductor target in response to the illumination rays, the imaging system comprising:
        an image sensor for forming an image from scattered light;
        one or more optical components that are arranged to direct the scattered light to the sensor via an imaging path; and
        a tunable spatial modulation device for selectively directing specific diffraction orders of the scattered light towards the image sensor while blocking selected other diffraction orders of the scattered light from reaching the image sensor.

2. An optical apparatus as recited in claim 1, wherein the tunable spatial modulation device is positioned at a plane that is substantially conjugate to the pupil of the imaging path.

3. An optical apparatus as recited in claim 2, wherein the imaging system further comprises relay optics for receiving the scattered light and forming the plane that is substantially conjugate to the pupil of the imaging path.

4. An optical apparatus as recited in claim 1, wherein the semiconductor target is formed from one or more grating structures and the tunable spatial modulation device is configurable to selectively direct only one or more ±n pairs of orders towards the sensor, wherein n is an integer that is not zero.

5. An optical apparatus as recited in claim 1, wherein the semiconductor target is formed from one or more grating structures and the tunable spatial modulation device is configurable to selectively direct only diffraction orders ±1 towards the sensor.

6. An optical apparatus as recited in claim 1, wherein the illumination system includes a second tunable spatial modulation device for selectively directing one or more of the illumination rays at specific illumination angles and numerical apertures towards the semiconductor target, wherein the second tunable spatial modulation device is positioned at a plane that is substantially conjugate to the pupil of the illumination path.

7. An optical apparatus as recited in claim 1, wherein the illumination system includes a second tunable spatial modulation device for selectively directing illumination rays substantially normal to the semiconductor target and at various numerical apertures towards the semiconductor target, wherein the second tunable spatial modulation device is positioned at a plane that is substantially conjugate to the pupil of the illumination path.

8. An optical apparatus as recited in claim 1, wherein the tunable spatial modulation device includes one or more of the following: a replaceable mechanical aperture, a spatial light modulator (SLM), or a diffractive optical element (DOE).

9. An optical apparatus as recited in claim 1, wherein the pupil of the imaging path is inaccessible and the tunable spatial modulation device is positioned at a plane that is the closest accessible plane to the pupil of the imaging path.

10. A method of measuring a characteristic of a semiconductor target, comprising:
determining a set of diffraction orders to use for imaging the semiconductor target;
configuring a metrology tool so as to image the target using the determined set of diffraction orders;
collecting an image of the target that is formed from the determined set of diffraction orders; and
determining and storing an overlay error based on the collected image.

11. A method as recited in claim 10, wherein the semiconductor target is formed from side-by-side gratings that are each formed in a different layer or by a different process and that are arranged for determining an alignment error between the side-by-side gratings, and wherein the determined set of diffraction orders include only ±n diffraction orders, wherein n is an integer and not equal to zero so as to maximize contrast of the collected image.

12. A method as recited in claim 10, wherein the semiconductor target is formed from side-by-side gratings that are each formed in a different layer or by a different process and that are arranged for determining an alignment error between the side-by-side gratings, and wherein the determined set of diffraction orders include only ±1 diffraction orders, so as to maximize contrast of the collected image.

13. A method as recited in claim 10, wherein the semiconductor target is formed from an upper grating over a lower grating that formed in different layers that are arranged for determining an overlay error between the upper and lower gratings, and wherein the scattered light has characteristics associated with the fine pitch of the gratings and with a course pitch produced by a Moiré effect, and wherein the semiconductor target is imaged using only ±n diffraction orders of the course pitch, wherein n is an integer and not equal to zero, and the fine pitch is left unresolved.

14. A method as recited in claim 10, wherein the semiconductor target is formed from an upper grating over a lower grating that formed in different layers that are arranged for determining an overlay error between the upper and lower gratings, and wherein the scattered light has characteristics associated with the fine pitch of the gratings and with a course pitch produced by a Moiré effect, and wherein the semiconductor target is imaged using only ±n diffraction orders of the fine pitch, wherein n is an integer and not equal to zero, and using many orders of the course pitch, including the zero order.

15. A method as recited in claim 10, wherein the semiconductor target is formed from an upper grating over a lower grating that formed in different layers that are arranged for determining an overlay error between the upper and lower gratings, and wherein the scattered light has characteristics associated with the fine pitch of the gratings and with a course pitch produced by a Moiré effect, and wherein the semiconductor target is imaged using only ±n diffraction orders of the fine pitch, wherein n is an integer and not equal to zero, and using only ±m diffraction orders of the course pitch, wherein m is an integer and not equal to zero.

16. A method as recited in claim 10, wherein the semiconductor target is formed from a first set of gratings having a first characteristic and a second set of gratings having a second characteristic that differs from the first characteristic.

17. A method as recited in claim 16, wherein the first and second characteristics correspond to first and second pitch values.

18. A method as recited in claim 16, wherein the first and second characteristics correspond to first and second rotation angles.

19. A method as recited in claim 16, wherein it is determined that there is no overlay error when a center of symmetry of the target equals a geometric center of the target.

20. A method as recited in claim 16, wherein m differs from n.

21. A method as recited in claim 16, wherein m equals n.

22. At least one computer readable storage medium having computer program instructions stored thereon that are arranged to perform the following operations:
determining a set of diffraction orders to use for imaging the semiconductor target;
configuring a metrology tool so as to image the target using the determined set of diffraction orders;
collecting an image of the target that is formed from the determined set of diffraction orders; and
determining and storing an overlay error based on the collected image.

23. At least one computer readable storage medium as recited in claim 22, wherein the semiconductor target is formed from a first set of gratings having a first characteristic and a second set of gratings having a second characteristic that differs from the first characteristic.

24. At least one computer readable storage medium as recited in claim 22, wherein the first and second characteristics correspond to first and second pitch values.

25. At least one computer readable storage medium as recited in claim 22, wherein the first and second characteristics correspond to first and second rotation angles.

26. At least one computer readable storage medium as recited in claim 22, wherein it is determined that there is no overlay error when a center of symmetry of the target equals a geometric center of the target.

27. An optical apparatus for measuring a characteristic of a semiconductor target, comprising:

an illumination system for generating and directing illumination rays towards a semiconductor target via an illumination path, wherein the illumination system includes a first tunable spatial modulation device for producing coherent modulated illumination rays that are directed towards the semiconductor target; and an imaging system for directing light scattered from the semiconductor target in response to the selectively modulated illumination rays, the imaging system comprising:

an image sensor for forming an image from scattered light;

one or more optical components that are arranged to direct the scattered light to the sensor via an imaging path; and a second tunable spatial modulation device positioned at a pupil of the imaging path for selectively directing specific diffraction orders of the scattered light towards the image sensor while blocking selected other diffraction orders of the scattered light from reaching the image sensor.

* * * * *